United States Patent [19]
Rogers

[11] Patent Number: 5,311,116
[45] Date of Patent: May 10, 1994

[54] MULTI-CHANNEL ELECTROMAGNETICALLY TRANSPARENT VOLTAGE WAVEFORM MONITOR LINK

[75] Inventor: Wesley A. Rogers, Grosse Pointe Park, Mich.

[73] Assignee: Electronic Development, Inc., Grosse Pointe Park, Mich.

[21] Appl. No.: 862,621

[22] Filed: Apr. 2, 1992

[51] Int. Cl.$^5$ .............................................. G01R 31/02
[52] U.S. Cl. ..................... 324/72.5; 324/72; 324/627
[58] Field of Search ............. 324/627, 628, 158 P, 324/72, 72.5

[56] References Cited

U.S. PATENT DOCUMENTS

| | | | |
|---|---|---|---|
| 3,743,925 | 7/1973 | Bossi | 324/629 |
| 3,991,397 | 11/1976 | King | 338/214 |
| 4,255,750 | 3/1981 | Riley | 324/627 X |
| 4,328,461 | 5/1982 | Butters et al. | 324/72 |
| 4,425,542 | 1/1984 | Tsaliovich et al. | 324/627 |
| 4,510,468 | 4/1985 | Mayer | 338/214 X |
| 4,647,844 | 3/1987 | Biegon et al. | 324/627 |
| 4,704,596 | 11/1987 | Coffey et al. | 338/214 |
| 4,737,708 | 4/1988 | Ari et al. | 324/158 F |
| 4,939,446 | 7/1990 | Rogers | 324/72 |
| 4,962,358 | 10/1990 | Svetanoff | 324/627 |
| 4,973,911 | 11/1990 | Marshall | 324/628 |
| 4,977,376 | 12/1990 | Shiek et al. | 324/613 |
| 5,006,788 | 4/1991 | Goulette | 324/95 |
| 5,068,616 | 11/1991 | Broyde et al. | 324/627 |

OTHER PUBLICATIONS

Knowles et al. "Cable Shielding Effectiveness Testing" IEEE Trans. on Electromagnetic Compatibility, vol. EMC-16, No. 1, pp. 16-23, Feb. 1974.
Preliminary Product Bulletin for Flurosint$^R$ 719 Insullated Monofilament and Flurosint$^R$ 819 Dual Line, by the Polymer Corporation, Feb., 1987.
Vehicle Level EMC Testing Methodology, by Gary F. E. Vrooman, Ford Motor Company, Jan., 1988.
Bulletin for Ailtech Current Probes, by Eaton Advanced Electronic, Nov., 1981.
Product Literature, Broadband Isotropic Probe Systems, by EMCO, Jan., 1990.
Product Literature, Model 5188 and Model 3718 Micrograbber Testclips, by ITT Pomona Electronics, Jan. 1989.

Primary Examiner—Kenneth A. Wieder
Assistant Examiner—Glenn Brown
Attorney, Agent, or Firm—Davis Hoxie Faithfull & Hapgood

[57] ABSTRACT

A multi-channel electromagnetically transparent voltage probe transmission link system for monitoring a plurality of voltage signals at a plurality of test points of a device under test that is subjected to a radiation field. Each channel includes two voltage probes, an electrical to optical signal transmitter, an optical signal transmission line and a receiver located out of the radiation field. The voltage probes contact and sense the voltage signals at the test point. The electrical to optical transmitters are removably mounted in a common base and are powered by either a common (or shared) power supply and/or by dedicated power supplies, such as rechargeable batteries. The receivers process the optical signals and provide display signals corresponding to the sensed voltage signal at the plurality of test points for evaluating the effect of the test radiation field. An attenuator which may be electromagnetically transparent is provided for attenuating a sensed voltage signal to a range suitable for processing by a transmitter device having a limited input range, over a frequency range of interest. The input circuits to the transmitter are provided with a centertap which provides a return current path for the voltage signals of the device under test that are sensed by a voltage probe. Low power consumption and low voltage drift circuits are used.

36 Claims, 7 Drawing Sheets

FIG. 5D ic interference (EMI).

MULTI-CHANNEL ELECTROMAGNETICALLY TRANSPARENT VOLTAGE WAVEFORM MONITOR LINK

FIELD OF THE INVENTION

This inventions relates to methods and apparatus for testing the susceptibility of devices, such as circuitry, to electromagnetic interference (EMI).

BACKGROUND OF THE INVENTION

Analog and digital electronic circuitry and attendant wiring may encounter serious operating difficulty in the presence of strong electromagnetic radiation fields. Such radiation fields are generally referred to as Electromagnetic Interference (EMI) fields. The circuits and attendant wiring may be shielded and filtered to provide some immunity to large EMI fields. Methods and apparatus, therefore, are required to test the susceptibility of the circuits and attendant wiring to EMI fields.

EMI testing is typically performed in shielded enclosures known as "screen rooms" or faraday cages, which provide an electromagnetic environment wherein only controlled EMI fields are present. Controlled EMI fields include, but are not limited to radiated near and far fields, stripline and TEM testing in the range of DC (more typically 10 KHz) to 18 GHz.

Apparatus typically used inside the screen room includes current probes attached to a harness wire and a coaxial cable which sends the signals detected by the probes to a receiver outside the screen room, where the effects of the EMI fields on the circuit are determined. Current probes suitable for monitoring current during EMI tests are commercially available. The Ailtech model number 91197-11 is one such device. Current probes, however, are not able to measure signals in the device under test in many circumstances, for example, at trace conductors of integrated circuits or into open circuits. For such signals, voltage probes are better suited.

To ensure the integrity of the screen room and the results of the EMI tests, any voltage measuring apparatus within the screen room should minimally perturb the controlled EMI fields and should be energized by a signal from the device under test only. For example, any test apparatus which might reradiate EMI fields impinging on the device under test or might otherwise inject any noise into the device under test must be avoided.

U.S. Pat. 4,939,446, which is assigned to the assignee of this invention, refers to one such voltage probe transmission link that is transparent to electromagnetic radiation fields for use in screen room testing. The transmission link uses a voltage probe, which includes a circuit grabber, such as a short insulated conducting clip, which is connected to an electrically overdamped input conductor. The circuit grabber is connected to the test point of the device under test. The insulation on the clip surface is coated, with any bright, metallic reflecting material, such as a silver paint or foil, to shield the clip from impinging EMI fields, thereby preventing the injection of signals into the device under test by the clip. The other end of the input conductor is connected to a hybrid electrical/optical data transmitter having a high impedance input port, which also is located inside the screen room. The transmitter has an optical output port that is connected to a receiver by way of an EMI immune optical fiber. The receiver is located outside the screen room where the effects of controlled EMI fields on the device under test are monitored, outside of the test electromagnetic radiation field.

The voltage probe input conductors may comprise a non-metallic thread core that is impregnated with fine conducting particles and a rigid, non-metallic insulating sheath. The electrically overdamped input conductors have a high distributed resistance so that they will not ring or tune at the frequencies of interest and, therefore, will not pick up energy from the EMI fields. As a result, the voltage probe transmission link may be used to monitor voltages of a device under test in the presence of a strong EMI field without effecting the device under test or the test results. The disclosure of U.S. Pat. No. 4,939,446 is hereby incorporated in its entirety herein by reference.

A commercial product, known by the tradename ETVL (Electromagnetically Transparent Voltage Monitor Link System), available from the assignee of this invention, Electronic Development Inc., is a commercial version of the voltage probe transmission link described in U.S. Pat. No. 4,934,446. The ETVL product has a hybrid electrical/optical data transmitter that has a single transmission channel that may have one of three signal formats, namely analog, digital, and pulse stretched. Only one signal format can be used at a time on the one transmission channel.

The commercial ETVL device and the device described in U.S. Pat. No. 4,939,446 monitor only a single test point and one voltage waveform (single ended or double ended) of the device under test. They also use one voltage probe for providing a return current path from the transmitter to the device under test.

SUMMARY OF THE INVENTION

It is, therefore, an object of the present invention to provide improved voltage probe transmission link apparatus and methods for monitoring the effects of an EMI field on a device under test.

It is another object of the invention to provide a multi-channel, electromagnetically transparent, voltage probe transmission link system that can monitor simultaneously a plurality of voltage signal waveforms of a device or system under test. It is another object to provide for monitoring simultaneously the effect of radiation fields at a plurality of locations without affecting the device under test or the test results. It is another object to monitor a plurality of waveforms at different locations along a circuit path. It is another object to monitor a plurality of voltage waveforms of a device under test inside a screen room to determine the effect of a controlled EMI field.

It is a further object of the present invention to provide a multi-channel voltage probe transmission link system that has a rechargeable power supply. It is another object to provide a plurality of voltage probe channels with a common (or shared) power supply to provide for extended operation inside a screen room. It is another object to provide each transmitter of a channel with a dedicated power supply.

It is another object of the invention to provide a radiation hardened, low power electrical to optical data transmitter for use in a screen room during extended periods of time.

It is another object of the present invention to provide a variable attenuator for attenuating the sensed voltage signals of the device that are larger than the effective dynamic range of the electrical to optical data transmitter. It is yet another object to provide a voltage divider attenuator that is transparent to electromagnetic radiation.

In accordance with this invention, a multi-channel electromagnetically transparent voltage probe transmission link system for sensing a plurality of voltage signals at a plurality of test points of a device under test subjected to a radiation field is provided. One aspect of the invention is directed to a multi-channel system comprising a plurality of voltage probe transmission link channels, each channel including two voltage probes, each voltage probe comprising a circuit grabber and an electrically overdamped input conductor in electrical contact with the circuit grabber. The circuit grabber (or grabbers) contact the device under test to monitor the voltage signals at one test point and the input conductor (or conductors) electrically transmits the sensed voltage signals.

Each channel also includes an electrical to optical transmitter for converting the voltage signals transmitted by the input conductor (or conductors) to an optical signal, and transmitting the optical signal over a suitable transmission line. The optical transmission line passes the optical signal out of the radiation field to a receiver for receiving the optical signal. The receiver processes the optical signal and provides a display signal corresponding to the sensed voltage signal at the test point. The display signal is then displayed and the waveforms may be evaluated to determine the effect, if any, of the radiation field on the device under test at the one test point.

Each voltage probe transmission link channel is associated with one of the plurality of test points of the device under test. Because the multi-channel link system is used to identify changes in the monitored voltage signal waveforms caused by the radiation field, it is not necessary that the displayed signals exactly display the sensed voltages. Rather, the display signals need only reflect relative changes in the monitored voltage signal waveforms as a result of the radiation field used during the test.

Each transmitter may be provided with a dedicated power supply such as a rechargeable battery. Also, the plurality of transmitters may be connected to a common (or shared) power supply by relatively short shielded conductors. Further, both a dedicated power supply and a common power supply may be used. The common power supply may be one or more discrete power supplies such that not all transmitters are connected to the same power supply. If each transmitter also has a dedicated power supply, the dedicated power supply may be switched out, automatically or by a switch, when the transmitter is connected to a common power supply. Preferably, the dedicated power supplies are located internal to the transmitters.

The plurality of transmitters, including any internal or common power supplies, are radiation hardened, either as an integrated system in an enclosure or as interconnected components, for the test radiation field intensities (V/m) and frequencies of interest.

Each transmitter is preferably releasably mountable on a common base or frame. The term releasably mountable means that each transmitter can be secured to and removed from a receptacle in the base and used to monitor a voltage in both conditions. The transmitter can be secured in place by any means, e.g., pins, latches, keys, friction, bolts and nuts, etc. Securing each of the transmitters to a common base provides for easy portability of the equipment, for example, into, out of, and within a screen room. It also provides for radiation hardening the base with the plurality of transmitters secured to the base.

In embodiments where a common power supply is used, the common power supply may be built into the base, and the base, the common power supply, and the plurality of cables connecting the common power supply to the transmitters may be radiation hardened as an integrated assembled unit.

That each transmitter may be removed from the base provides for locating each transmitter proximate to the test point it is to monitor. This is advantageous where the device under test is a large object, such as an automotive vehicle or its electrical system or a local area network of computers, and the distance between two transmitters for two test points being monitored is greater than the desired length for the input conductor of the voltage probe. This in turn provides for using the same length input conductor for each voltage probe, and maintaining that length to less than a meter. This is advantageous in view of distributed resistance of the input conductor material, which results in a resistance that is directly proportional to its length. As noted, each transmitter also may be advantageously provided with an internal power supply. Thus, if the cable connecting the transmitter to the base power supply becomes problematic with respect to radiation hardening, the cable may be omitted and the internal power supply switched in.

Removability of the converters also provides for using less than the full plurality of transmission channels, rapid replacement of a transmitter that is in need of service (or a recharge when operating on an internal battery) and quickly and easily changing the mixture of channel types of the plurality of channels, as between analog and digital transmitter channels. This is particularly advantageous when complicated digital integrated circuits having analog sensors is being tested and an EMI susceptibility problem has been identified, yet needs to be better isolated along a signal path having analog and digital signals.

An advantage of a common power supply is that it may be larger and have a longer useful life than using a plurality of dedicated power supplies which preferably are small enough to fit into the transmitter enclosure. For example, the common power supply may be a heavier 4.8 amp-hour rechargeable battery having a battery life of 30 hours when connected to two transmitters. In contrast, suitable internal power supplies for each transmitter may be lighter, smaller, and have a shorter useful life, for example, a 12 volt 0.6 amp-hour battery having a useful life of seven hours. Further, the internal battery may be automatically switched in if the common power supply becomes discharged below a threshold voltage or disconnected, thereby extending the useful life of the voltage probe transmission link channels. Similarly, if any transmitter is not being used, it may be automatically powered down or manually switched off so that it does not unnecessarily drain the power supply.

Also, the common power supply (with or without the internal battery) may be located adjacent the base, or outside of the radiation field and coupled to the transmitters using appropriately shielded cables. In yet another embodiment, the common power supply may be derived from conventional line current that is converted to the DC voltage level used by each system, preferably a regulated DC voltage.

Preferably, each of the transmitters is provided with a plug or a receptacle that is compatible with a corresponding receptacle or plug in the base so that when the transmitter is secured to the base, it is connectable to a common power supply. The connection may be automatic through the plug/receptacle connection, or it may be controlled by a suitable switch or conventional shielded cables and connectors.

Each of the plurality of voltage probe transmission links also comprises a receiver, which is located out of the effective range of the test radiation field. Each receiver receives the optical signals corresponding to the sensed voltage of one test point from the optical transmission line, and processes the optical signals to produce a display signal. The plurality of receivers are preferably releasably mountable on a common base and are respectively connected to a suitable device (or devices) for displaying the plurality of display signals corresponding to the plurality of voltage signals monitored at the different test points of the device under test. A suitable display may be a multi-channel display device or a plurality of single channel display devices, for example, one or more single or multi-channel oscilloscopes, spectrum analyzers, voltage meters, or similar devices.

Surprisingly, it was discovered that efforts to multiplex the optical signals corresponding to the plurality of test points, to permit use of a single optical fiber passing out of the radiation field, tended to mask susceptible device voltage signal waveform changes that occurred during RF testing. In particular, a prohibitively high sampling rate would be required to detect small waveform changes in a waveform having a 30 MHz frequency. Although multiplexing may be useful for a two or three channel transmission link system at low radiation field frequencies, such a system is not practical or sufficient to satisfy the commercial needs of the users who require, for example, six (or more) channels to monitor a device under test at frequencies up to 18 GHz.

Another aspect of the present invention is directed towards an attenuator for attenuating a sensed voltage signal to a range suitable for processing by a device having a limited input range, over a frequency range of interest. One embodiment of this aspect of the invention concerns an attenuator for attenuating the sensed voltage at the device under test for processing by a low power transmitter, which has a limited input signal range. One such attenuator includes a voltage probe and a length of an electrically overdamped conductive wire having a distributed impedance (resistance and capacitance) along its length, the length connecting the input conductor of the voltage probe to a ground (virtual or actual). This results in the voltage input at the probe being divided across the first length and the distance between the voltage source and the location where the first length is connected to the voltage probe input conductor. Thus, by adjusting the relative location of the connection along the probe input conductor, or by adjusting the length of the first length (or both), the magnitude of the voltage source may be attenuated by a selectable amount. This provides for a signal, corresponding to the monitored voltage signal, that has a relatively full scale peak to peak swing with respect to the transmitter input capacity.

Preferably, the power supply (dedicated and/or common) is monitored by a battery charge monitor to provide an indication of the net charge on the power supply. This is important because if the power supply voltage falls below a preselected level, e.g., 10 volts, the transmitter circuits may not operate in a linear manner, and, if undetected, could transmit distorted signals that could be mistaken for signals affected by a radiation field. The battery charge monitor could be used to trigger a switch to change automatically between a common power source and an internal power source such that the internal power source is used as a backup power supply.

Another aspect of the present invention concerns another improvement to U.S. Pat. No. 4,939,446 concerning the electrical to optical transmitter and monitoring the voltage waveform at a test point of the device under test. In this aspect, the input circuits to the differential amplifier of the transmitter are provided with a centertapped interconnection. This centertap provides a return current path for the signals of the device under test that are sensed by a voltage probe. Accordingly, the need for a reference ground return voltage probe connecting the device under test to the transmitter centertap voltage has been eliminated. Thus, no more than two voltage probes are now needed to monitor a differential output voltage signal, in place of the three probes previously required. For monitoring single ended output voltage signals, the second input circuit of the transmitter is preferably connected to the ground of the device under test.

In a preferred embodiment, the centertap voltage return is obtained by respectively inputting the sensed voltage signals from the two input conductors into two potentiometers at the input circuits of the transmitter, such that the other ends of the potentiometers are connected to a common centertap voltage. Advantageously, this centertap return simplifies connection of each channel transmitter to a test point of devices under test and reduces the number of voltage probes required. This reduces the cost of the multi-channel device and the time required to select and connect the voltage probes to the test point of the device under test or reconnecting the voltage probes from one test point to another. The savings are multiplied by the number of channels used.

BRIEF DESCRIPTION OF THE DRAWINGS

Further features of the invention, its nature and various advantages will be apparent from the accompanying drawings and the following detailed description of the invention in which like reference numerals refer to like elements and in which.

DETAILED DESCRIPTION OF THE INVENTION

Figure 1:
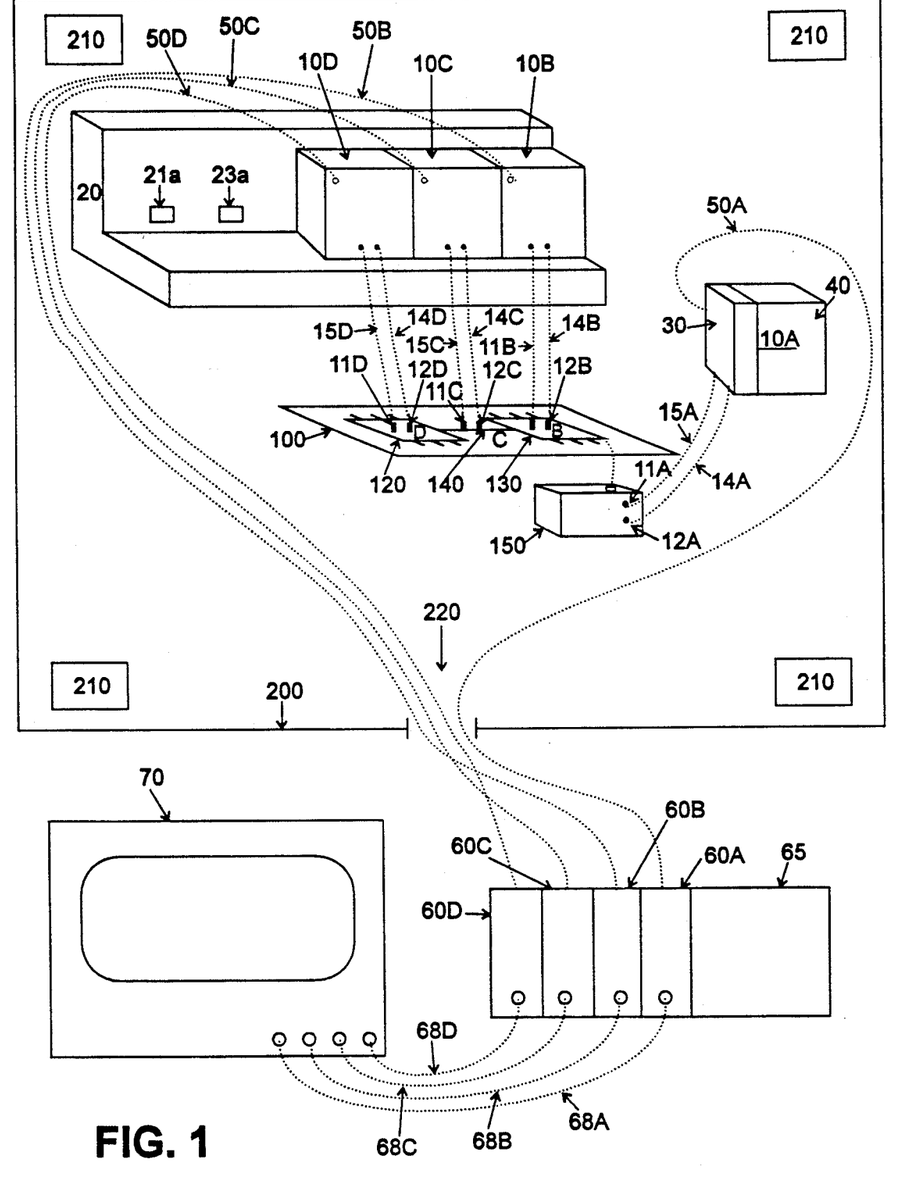
FIG. 1 is an isometric view of a test set-up for a multichannel EMI transparent voltage waveform monitor link in accordance with a preferred embodiment of the present invention.

FIG. shows a preferred embodiment of the multi-channel transmission link system of the present invention. Such a system includes a plurality of channels, e.g., six or more, of which only four channels are shown. The four channels are respectively designated by the suffix letters a, b, c, and d. These suffixes are used throughout the specification to designate corresponding elements of the same channel. As it will appear from the context of the discussion, the suffixes may be omitted when a characteristic common to each of the channels is discussed.

The system shown in FIG. 1 has four transmitter modules 10a, 10b, 10c and 10d. Transmitters 10b, 10c, and 10d are shown mounted to a common base 20. Base 20 is illustrated in FIG. 1 as an L shaped rack, but may have any other convenient shape that is compatible with retaining transmitters 10. Transmitter 10a is shown removed from base 20. Receptacles 21a and 23a on base 20 are visible. Receptacle 21 may be used for alignment and correct seating of transmitter 10. Receptacle 23 may be used when coupling transmitter 10 to a common power supply (e.g., supply 80 in FIG. 2).

Figure 3:
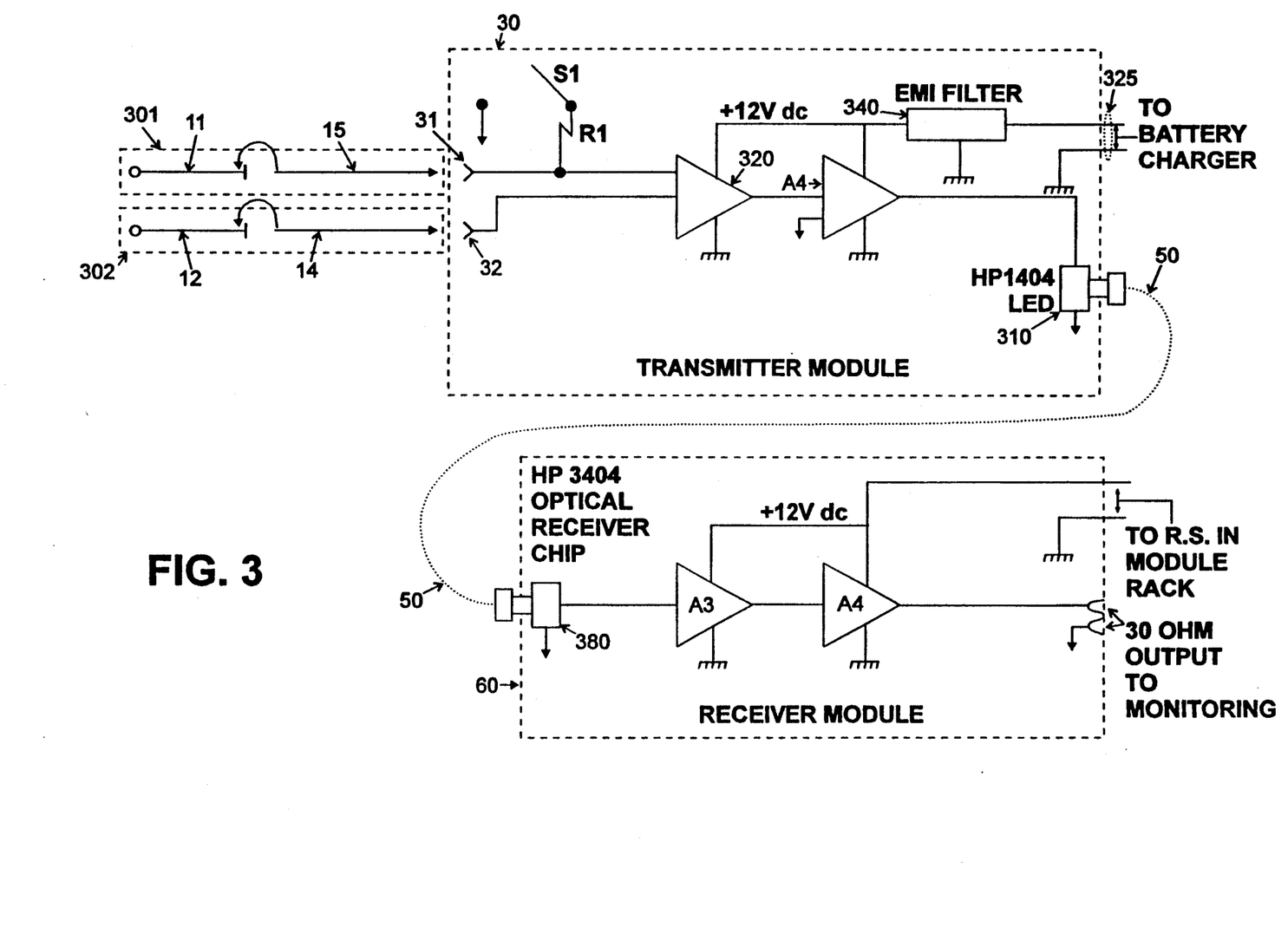
FIG. 3 is a circuit block diagram for an analog channel voltage probe transmission link in accordance with an embodiment of the invention.

Each transmitter 10 is used to monitor a different test point, respectively designated by reference characters a, b, c, and d, of a device under test 100. Referring also to FIG. 3, each transmitter 10 has a pair of voltage probes 301 and 302 such that a pair of circuit grabbers 11 and 12 are respectively connected across the double ended output of the test point in device 100 for monitoring the voltage at the test point. Each of the circuit grabbers 11 and 12 are respectively connected to transmitter 10 by electrically overdamped conductors 14 and 15. If the test point is a single ended output, voltage probe 302 need not be used.

Regarding the circuit grabbers, they are metallic grabbers inserted at the end of the overdamped conductors. The grabbers are coated with a paint that reflects E-fields up to 200 V/m over sweep frequencies as high as 18 GHz. A hard baked top coat of plastic, e.g., polyurethane, such as Sherwin-Williams brand Polane B, is applied over the reflective paint to prevent scratches that might destroy the reflecting capacity of the paint. Untreated grabbers become more sensitive to pickup at frequencies above 1.0 GHz.

To connect to an exposed wire or circuit lead, a clip type grabber may be used. To connect to a harness cable coated with insulation, a pin type grabber that penetrates the insulation may be used. Thus, according to the present invention, a plurality of channels having respective voltage probe pins may be inserted at different lengths along a harness to check for resonances. Other circuit grabber shapes and configurations may be used for securely fastening to the test point of the device. This includes wires having a reflective coating soldered to test points. The latter is particularly useful if the device under test is being moved during the test. Each circuit grabber may be one of the clip or pin as described in U.S. Pat. No. 4,939,446.

Regarding the electrically overdamped input conductor, it is preferably a non-metallic material made from a glass and carbon slurry that is wrapped (or coextruded) with a rugged nylon protective sheath and conducts the monitored waveform therethrough by the well known displacement current mechanism. These conductors are transparent to electrical fields as high as 200 V/m in a frequency range between 10 KHz and 18 GHz, and to magnetic fields between 30 Hz and 80 KHz. For example, an acceptable probe input conductor is known by the tradename FLUOROSINT ® 719, available from the Polymer Corporation of Reading Pa. It has a carbon/fluorocarbon core that is 0.030 inches (0.76 mm.) in diameter and enclosed in a transparent nylon insulating cover to yield an outer diameter of 0.040 inches (1.02 mm.), and a resistance per unit length of 20,000 to 30,000 ohms per inch (7874 $\Omega$/cm. to 11811 $\Omega$/cm). The input conductor material has a small amount of distributed capacitance that causes sensed voltage signal waveforms, monitored from device 100, to roll off at high frequencies. This roll-off is compensated for by using wide bandwidth amplifiers from DC to 40 MHz in the transmitter circuits. The input conductor may be a single strand or multiple strands, e.g., 4 to 5 strands, connected in parallel to lower the effective impedance, to increase its structural rigidity as a cable. A preferred overdamped input conductor and circuit grabbers, all of which are transparent to the radiation field, are further described in U.S. Pat. No. 4,939,446.

Figure 2:
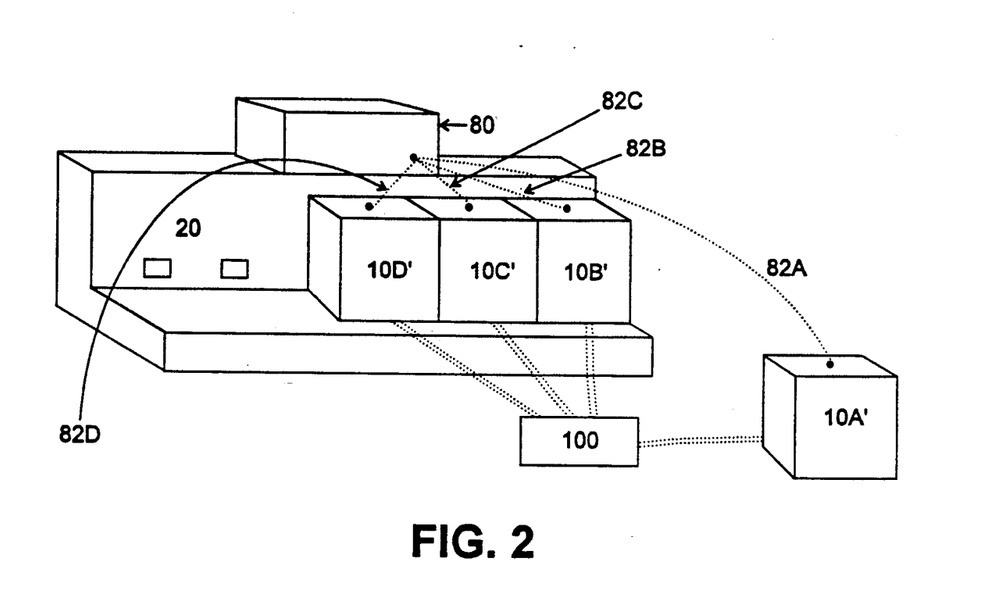
FIG. 2 is a block diagram of an alternate embodiment of the test set-up of FIG. 1.

Referring to FIGS. 1-3, each transmitter 10 includes an electrical to optical converter circuit 30. Converter circuit 30 has inputs 31 and 32 for receiving the voltage drop across circuit grabbers 11 and 12, as transmitted by conductors 14 and 15, and power from a power supply, and has as an output an optical signal.

The optical signal is coupled to an optical transmission line 50, e.g., a conventional fiber optic cable (or cable bundle), that is transparent to the radiation field at the frequencies of testing. Transmission line 50 has a length that is sufficient to extend from transmitter 10 out of the radiation field to which the device 100 is exposed, for example, 10 meters or more. The power supply may be an internal battery 40 (see FIG. 1), a common battery 80 that is shared by one or more other transmitters 10 (see FIG. 2) or both (not shown).

In the embodiments shown in FIGS. 1 and 2, device under test 100 includes a printed circuit board 110 having a microprocessor device 120 and a receiver logic circuit 130 that are connected by a lead 140 and a separate power supply 150 that is connected to circuit 130 by a harness 160. Thus, test points a, b, c and d represent different locations along one or more circuit paths of device 100.

The device 100, the transmitters 10a, 10b, 10c, and 10d, and base 20 are physically located inside a conventional screen room 200. The screen room 200 has a plurality of antenna devices 210 (four such antennas 210 are shown) for providing a controlled EMI field (i.e., a controlled radiation field) for testing device 100 for the effects of the EMI field, i.e., susceptibility to electromagnetic radiation, electromagnetic emission, or both. It is to be understood that the invention is applicable to testing the effect of any radiation field on any device (or system) under test, whether or not the test is performed in a screen room, and whether or not the test is conducted using a controlled radiation field, a near field emitted from a waveguide, a strip line, a TEM field, or an ambient (near or far) radiation field.

Referring to FIG. 1, the plurality of optical transmission lines, e.g., lines 50a, 50b, 50c, and 50d, are passed through a waveguide-beyond-cutoff filter 220 located in the enclosure of the screen room 200, to a like plurality of receivers 60, namely receivers 60a, 60b, 60c and 60d. Filter 220 is used to prevent transmission of electromagnetic radiation in either direction through the aperture, which transmission may adversely affect the test.

Each of the receivers 60 is used to convert the optically transmitted signal to a display signal, which can then be transmitted over a compatible conductor 68 for display on a display 70. Preferably, the display signal is an electrical signal and conductor 68 is a conventional coaxial cable, such as RG-58/U type cable. Receivers 60 are preferably removably mounted in a rack 65. Receivers 60 also may be provided with dedicated 12 volt DC power supplies or a common 12 volt power supply. These power supplies may be rechargeable batteries internal to each receiver or common to the receivers, or derived from one or more AC to DC power supply devices operating from a wall outlet. Preferably, the receivers 60 are individually switched so that the receivers 60 for unused channels may be turned off. Removability of the transmitters 10 and receivers 60 also allows for replacing a unit in need of service or in need of a battery charge with a fully operational and charged unit, or changing a channel transmission link from a digital to an analog channel or vice versa, without significantly delaying or interfering with testing of the device under test.

Each channel of the multi-channel system may be an analog channel or a digital channel. Such types of channels are known and have been used in the aforementioned commercial ETVL product, but only in a configuration that has both channel types such that the user may select and use only one channel type at a time. Thus, in the present invention, each transmitter 10 is a single type of channel and both the number of channels and the type of channel may be selected to permit optimum monitoring of a wide variety of voltage signal waveforms simultaneously from device 100.

Analog channels are particularly useful for transmitting monitored voltage waveforms at frequencies at and below about 5 MHz. Digital channels are particularly useful for transmitting frequencies above 5 MHz, in which a fast rise and fall time are used, e.g., 25 nanoseconds or less. The digital channel provides a pulse stretching function, taking advantage of the distributed capacitance of the voltage probe input conductor. The pulse stretching ratio is about a 4:1 ratio. This is particularly useful for viewing waveforms comprising narrow pulse periods that are long with respect to pulse width.

As shown in FIG. 1, display 70 may be a multi-channel scope capable of displaying the monitored signals from test points a, b, c, and d, simultaneously. Display 70 is preferably capable of monitoring the waveforms of device 100 before and after the application of the radiation field of the test or, more specifically, the radiation field at two intensity levels. Typically, one radiation field intensity level will be selected because no effects of the radiation field appear in the monitored voltage signal waveforms and a second intensity level will be selected because the affect of the radiation field does appear in some, if not all, of the monitored test point signals.

Voltage waveform changes provide the user with both test failure and diagnostic information during signal tracing. This information can be used to isolate the electromagnetic coupling or emission problem in the device 100, i.e., isolate the problem to a specific circuit component, element, or lead. Indeed, the present invention provides for simultaneously monitoring different points along a signal path in a circuit or device and identifying the likely source of the EMI based on the relative changes in the plurality of voltage signal waveforms along the signal path. Thus, the likely problem can be more quickly located. Further testing to isolate more specifically the problem can be conducted. Thereafter, suitable corrective steps can be implemented, for example, insertion of a suitable EMI filter to resolve the EMI susceptibility or emission problem in a given application of device 100.

Referring to the embodiment of FIG. 1, each transmitter 10 has a dedicated power supply 40, which is preferably a 12 volt rechargeable lead acid battery. Preferably, the dedicated power supply 40 is located internal to the enclosure of transmitter 10, which also encloses converter circuit 30 and the enclosure is radiation hardened. In such an embodiment, the battery harness connecting battery 40 to the power input reference 325 of converter circuit 30 is located inside the hardened enclosure and need not be separately shielded or electromagnetically transparent.

FIG. 2 shows an alternate embodiment of a portion of the test set-up of FIG. 1 wherein each transmitter 10' receives power from a common power supply 80 over one of a plurality of conductors 82. In this embodiment, transmitter 10a', which is removed from base 20, is provided with power from power supply 80 by an EMI shielded cable 82a. It is desirable to keep cable 82a as short as possible.

Preferably, the common power supply 80 is associated with the base 20 such that it is connected to the base 20 or enclosed interior to base 20. This provides for enhanced radiation hardening of the base, common power supply, and the plurality of cables as an integrated unit. For those transmitters 10' that are removed from base 20 by a distance greater than 15 meters, it may be desireable to provide such transmitters 10' with a dedicated, more preferably, internal, battery 40. This avoids the risks of a long cable 82 coupling to the radiation field or emitting radiation and affecting the test results. In such circumstances, use of an internal battery will optimize radiation transparency.

A larger common power supply (not shown), located separate from the base 20, or even outside of the radiation field also may be used with appropriate shielded cables. Preferably, the common power supply is one or more rechargeable batteries located in the radiation field and radiation hardened. This is to avoid the problems inherent in using an AC to DC power supply in an electromagnetic, particularly an RF, field and using long battery harnesses.

Importantly, the multi-channel voltage probe transmission link system, and in particular the transmitters 10 (or 10') and their power supply, namely either a dedicated internal battery 40, a common battery 80, or a remote battery or power supply (not shown in FIGS. 1 and 2), is to be radiation hardened to at least the radiation intensity levels for the frequencies of the test. This is so that the multi-channel system will not radiate EMI during the test or couple to radiation from the radiation field, which could perturb the radiation field or inject signals into the device under test and adversely affect the quality of the test.

Typically, each of transmitters 10 must be hardened against both near and far fields to 100 volts per meter (V/m) over the frequency range of from 10 KHz to 18 GHz. Base 20, together with any internal or external common power supply 80 and cables 82, is similarly radiation hardened with the transmitters 10 secured to and removed from base 20. It also is preferred that the test apparatus be compatible with the conventional TEMPEST and EMP requirements.

Figure 3A:
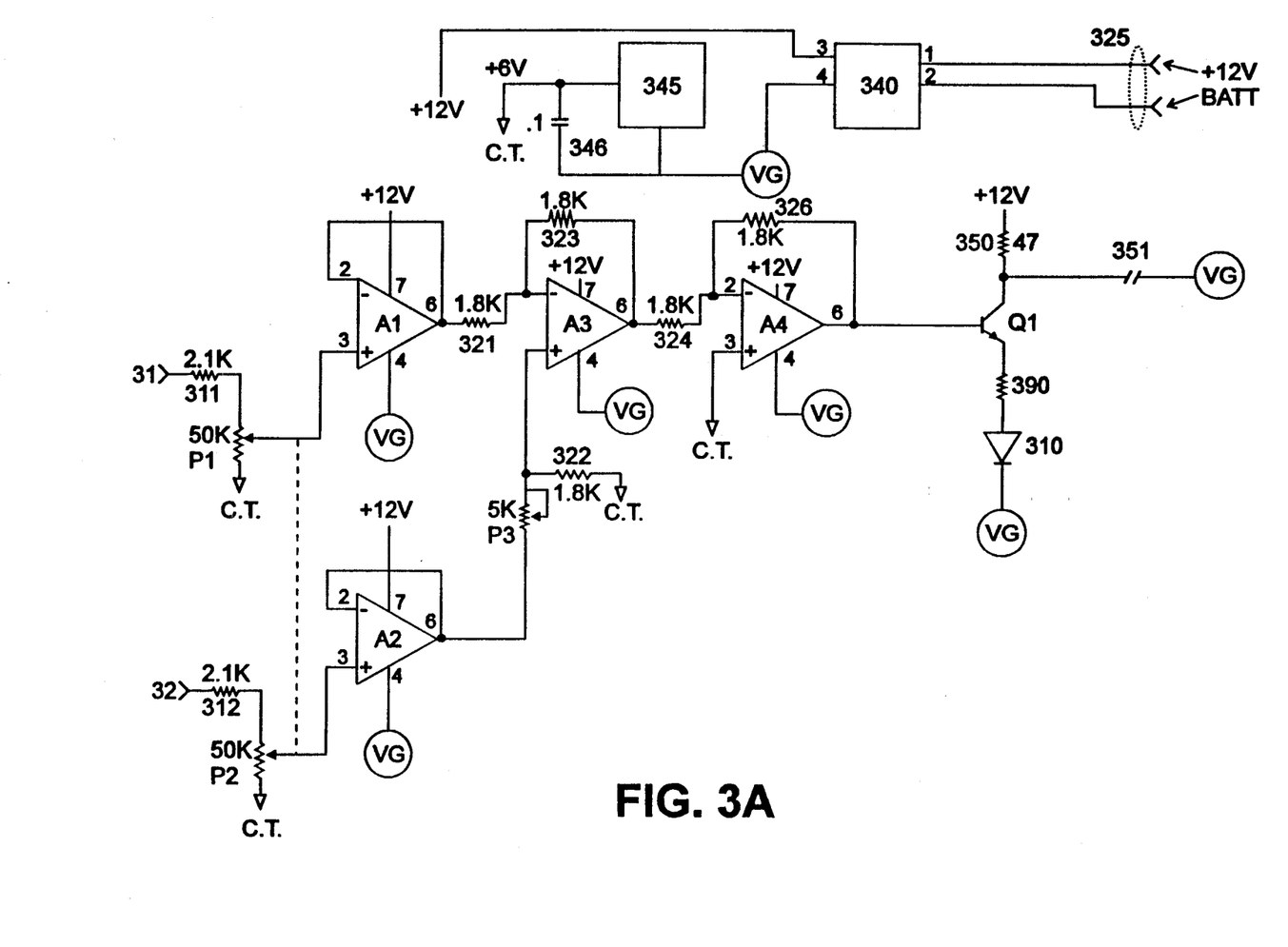
FIG. 3A is a circuit schematic for the analog channel electrical to optical transmitter of FIG. 3.

Referring to FIGS. 3 and 3A, analog channel converter circuit 30 is a low-gain, direct-coupled, optical transmitter amplifier circuit which transmits analog waveforms through the transmitter output LED 310, into optical cable 50, and to a compatible analog receiver circuit 60. LED 310 is operated along a linear portion of its output characteristic so that the intensity of the light emitted is directly related to the magnitude of the voltage drop at the test point.

Analog converter circuit 30 is connected to a test point of device 100 (not shown in FIGS. 3, 3A) using two voltage probes 301 and 302 (not shown in FIG. 3A). Voltage probe 301 includes circuit grabber 11 and a first length of overdamped input conductor 15 and voltage probe 302 includes circuit grabber 12 and a first length of overdamped input conductor 14. Preferably, the first length of input conductor 14 and the first length of input conductor 15 are the same. Regarding the test point signal of device 100, grabber 12 is connected to one of the "test point" and a "return path" in device 100, which may be a circuit ground of device 100, and grabber 11 is connected to the other of the test point and the return path, thereby to obtain a differential signal waveform which is provided to inputs 31 and 32 of converter circuit 30. The differential waveform is input to a differential amplifier circuit 320.

Referring to FIG. 3A and amplifier circuit 320, the signal input at input 31 is passed across an input resistor 311, into one end of a potentiometer Pi, and out the wiper contact of potentiometer P1 into the noninverting input of amplifier A1. The input signal at input 32 is similarly passed across an input resistor 312, a potentiometer P2, and the noninverting input of an amplifier A2. Input resistors 311 and 312 are each preferably 2.1 KΩ and are optionally used to prevent bad overdriving of converter circuit 30 in the event that potentiometers P1 and P2 are not properly adjusted. Potentiometers P1 and P2 are ganged together to provide the same resistance. The ends of potentiometers P1 and P2 on the other side of their wiper contacts from the input signals are connected to a common centertap CT, and thereby provide a return current path to the test point of device 100. Thus, the problem of requiring a separate voltage probe to provide such a return current path to the device under test, as disclosed in U.S. Pat. No. 4,939,446, is overcome.

Potentiometers P1 and P2 each may be a 50 KΩ potentiometer, although it is believed that other potentiometers having resistance values up to 1.0 MΩ may be used. In operation, potentiometers P1 and P2 are first placed in their full resistance positions, ganged together, and then adjusted to reduce the resistance to a level that provides the desired waveform amplitude range into amplifiers A1 and A2.

Amplifiers A1 and A2 are preferably provided with the same voltage to current converter amplifier configuration, i.e., a unity gain buffer amplifier having the output pin 6 fed back to inverting input pin 2. A +12 volt supply is provided at pin 7 of amplifiers A1 and A2 from the +12 volt battery, e.g., battery 40 (FIG. 1) or 80 (FIG. 2), obtained as illustrated from pin 3 of a commercial EMI filter 340 (and described below). A virtual ground return is provided at pin 4 of amplifiers A1 and A2, obtained from node VG, corresponding to the return path to the +12 volt supply and thus the point of lowest potential in circuit 30. In this embodiment, amplifiers A1 and A2 are insensitive to any relative voltage drift in the power supply.

The outputs of amplifiers A1 and A2 are respectively fed to the inverting input at pin 2 and the noninverting input at pin 3 of a differential amplifier A3. Amplifier A1 output at pin 6 is passed across a 1.8 KΩ resistor 321 into pin 2 of amplifier A3. Amplifier A2 output at pin 6 is passed across a voltage divider circuit of potentiometer P3 and resistor 322 connected to the centertap CT (described below) into pin 3 of amplifier A3. Potentiometer P3 is a 5 KΩ potentiometer and resistor 322 is a 1.8 KΩ resistor. They are used to provide a common mode rejection for the selected input resistance to amplifiers A1 and A2. In other words, with potentiometers P1 and P2 at their selected values and terminals 31 and 32 tied together, potentiometer P3 is adjusted to obtain a balance between inputs 31 and 32. Amplifier A3 is provided with a resistor 323 of 1.8 KΩ in the feedback loop to provide unity gain. Other resistance values could be used, for example, to provide a low gain other than unity.

The output of differential amplifier A3 at pin 6 is then input to the inverting input at pin 2 of amplifier A4. Amplifier A4 is configured as a unity gain inverting amplifier, having a 1.8 KΩ resistor 324 at the inverting input and a 1.8 KΩ resistor 326 in the inverting feedback loop. Amplifiers A3 and A4 are also provided with bias supplies of +12 volt at pin 7 and virtual ground at pin 4. The noninverting input of amplifier A4 is connected to the centertap CT.

The centertap CT is provided by a voltage regulator 345. Voltage regulator 345, such as a MC7805, manufactured by Motorola, Inc., converts the +12 volt supply and provides a regulated +6 volts output across a 0.1 μf decoupling capacitor 346 which is connected to virtual ground at node VG. Thus, the +6 volt centertap CT is electrically connected to the noninput leads of potentiometers P1 and P2, to resistor 322 and to the noninverting input of amplifier A4.

The output of amplifier A4 is passed to the base of transistor Q1 which is a an RF transistor, such as model 2N3904 or the equivalent. The collector of transistor Q1 is connected to the +12 volt supply across decoupling resistor 350 and capacitor 351 which are respectively 47 Ω and 0.1 μf. Capacitor 351 is tied to the virtual ground at node VG. The emitter current of transistor Q1 is passed across a DC bias resistor 353 of 390 Ω and into light source 310. Light source 310 is preferably a commercial light emitting diode device, model No. HFBR 1404, manufactured by Hewlett Packard, having a nominal wavelength of 820 nm.

EMI Filter 340 is inserted between converter circuit 30 and the two leads connecting the circuit to the power supply. It is used to suppress electromagnetic susceptibility radiation over the frequency range of interest. It may be any filter suitable for such purpose, and preferably is model BNX002, available from MURATA Manufacturing Co., Ltd., Savannah, Ga., which has a flat filter response of between 0.01 and 1.0 GHz.

In the design of converter circuit 30 of FIG. 3A, it is important that each element connected to the virtual ground be directly connected to node VG by a separate dedicated conductor (not shown), i.e., to the output pin 4 of EMI filter 340. This will minimize the circuit noise to a level that is at about 10 mV or less. The connection between the +6 volt centertapped output CT of the +6 volt regulator 345, may, but need not, be made by a separate conductor to each of potentiometers P1 and P2, resistor 322, and amplifier A4 (not shown).

The use of amplifier A4 as an inverting amplifier in converter circuit 30 provides for simplifying the design of the compatible receiver 60.

Figures 4, 6:
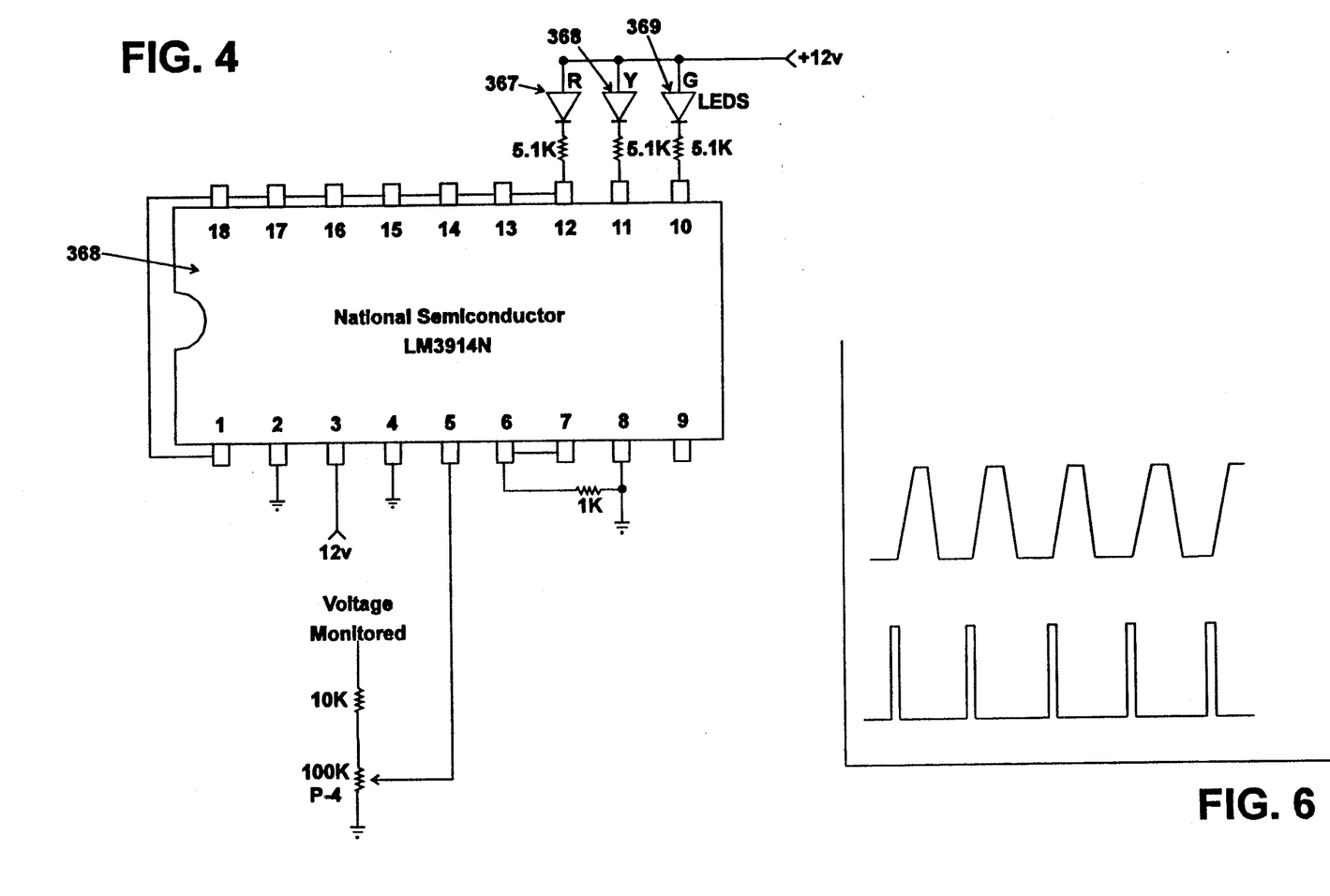
FIG. 4 is the battery charge monitor circuit of FIG. 3A.
FIG. 6 is a representation showing the effects of the radiation field for the two test points of the device under test of FIG. 5 after electromagnetic susceptibility is corrected.

Referring to FIGS. 3A and 4, the converter circuit 30 also includes a battery charge monitor 365, connected between terminals 3 and 4 of EMI filter 340. Monitor 365 preferably comprises a bar graph driver device 366, such as part no. LM3914N, manufactured by National Semiconductor and three different colored light emitting diodes (LEDs) 367, 368 and 369. Device 366 is configured to turn on one of the LEDs when the power supply is within the range of one of the LEDs. Thus, LED 367 is preferably a red LED, e.g., Dialco part no. 558-0102-001, and is illuminated when the power supply is less than 11 volts; LED 368 is preferably a yellow (amber or orange) LED, e.g., Dialco part no. 558-0202-002, and is illuminated when the power supply is between 11 and 12.8 volts; and LED 369 is preferably a green LED, e.g., Dialco part no. 558-0302-001, and is illuminated when the power supply is between 12.8 and 13.6 volts.

Monitor 365 is configured as shown in FIG. 4, with each of the LEDs 367, 368 and 369 respectively connected in series between the power supply and 5.1 K$\Omega$ resistors and to pins 12, 11 and 10 of device 366. Regarding device 366, pin 3 is connected to the power supply; pins I, 18, 17, 16, 15, 14, 13 and 12 are tied together; pins 2, 4 and 8 are tied to the virtual ground; pin 5 is connected to a bias voltage circuit including a voltage divider connected between the +12 volt power supply and virtual ground, comprising a 100 K$\Omega$ potentiometer P and 10 K$\Omega$ resistor, for setting the voltage thresholds for turning on and off the different LEDS 367, 368 and 369; pins 6 and 7 are tied together; and pins 6 and 8 are tied together by a 1 K$\Omega$ resistor LEDs 367, 368 and 369 are preferably visible to the operator, more preferably conveniently located on or visible through the enclosure of transmitter 10. Circuit 366 also may be connected to a switch, for example, to actuate an audible alarm or to power down automatically the transmitter 10 when the voltage falls below a threshold level, e.g., when the red LED is illuminated.

Converter circuit 30 thus has an automatic gain and bias adjust circuit that maintains its output in the linear operating region of the light source LED 310. Amplifiers A1 and A2 provide unity gain between input terminals 31 and 32 and the input of amplifier A3, and a low gain at the output of transistor Q1, which output drives LED 310. It is capable of operating with a power supply of between 10 and 15 volts. Below 10 volts, there may be a loss of linearity in the circuit that could lead to inaccurate signal conversion and distorted waveforms. Accordingly, the threshold level of battery charge monitor is set somewhat above the voltage where loss of linearity may occur. The circuit is a low power circuit and requires only about 70 mA during operation. Accordingly, one converter circuit 30 can operate for about 15 hours on a 1.2 A-H rated +12 volt battery.

The resultant DC drift is thus maintained in the mV range and the noise level is on the order of 10 mV.

Referring to FIG. 3, an embodiment of an attenuator that may be used is shown. In this embodiment, a switch S1 is used to switch a short length of material R1 (i.e., the same non-metallic, electrically overdamped input conductor of conductor 15) to connect input terminal 31 of amplifier A1 to the virtual ground. Although shown interior to transmitter 10, the material R1 could be located outside of transmitter 10.

The resistance of material R1, i.e., its length, is selected to be a fraction of the length of conductor 15. Thus, when material R1 is placed across the series resistance of probe 301, it reduces its input voltage by the fraction. A preferred fraction is one tenth. Thus, R1 is 1.9 inches for a voltage probe input conductor 15 length of 19 inches. When actuated, switch S1 allows higher than normal TTL, CMOS and other common device 100 digital voltage waveforms to be monitored.

Figure 7:
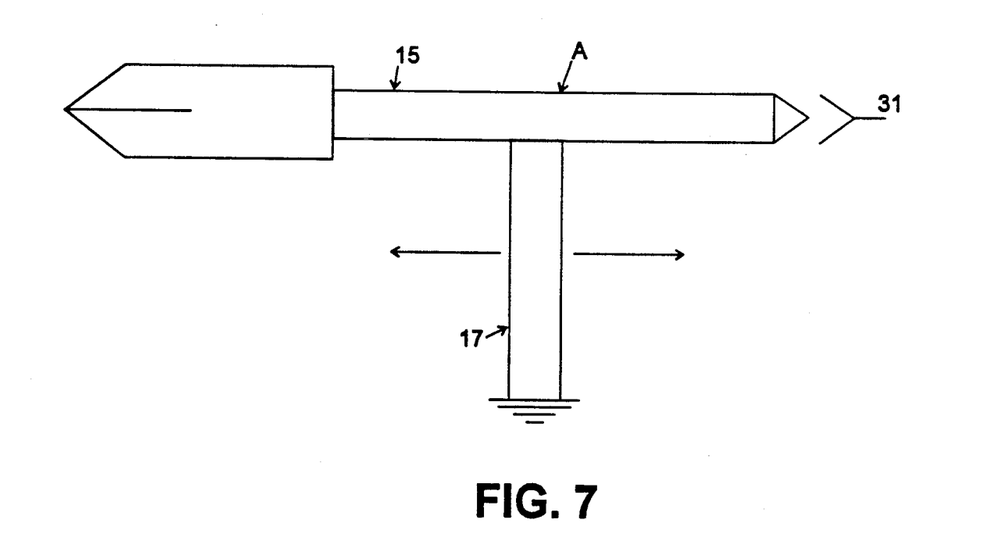
FIG. 7 is a diagram of a voltage divider transparent to electromagnetic radiation in accordance with a preferred embodiment of the present invention.

Referring to FIG. 7, another attenuator design is shown. In this embodiment, a short length of material 17 (i.e., the same non-metallic, electrically overdamped conductor of conductor 15) connected between a selected location A on conductor 15 and the virtual ground VG. The proportions of conductor 17 and the relative distance of point A from circuit grabber 15 are selected so that the combination of conductor 15 and conductor 17 form a voltage divider. Thus, by adjusting position A, the point of electrical contact, the voltage divider value is selected and then the voltage signal monitored at the test point can be attenuated to within the desired limits of converter circuit 30, e.g., ±6 volts, more preferably, ±3 volts. Such an attenuator also is electromagnetically transparent and thus may be located internal or external to the transmitter 10 enclosure.

Thus, the present invention provides for using an attenuator to monitor signals from device 100 that are as high as 150 volts, peak to peak, DC or AC, without driving amplifiers A1 and A2 into saturation, and with minimum distortion, i.e., below 10 mV of noise.

A compromise between low value resistors for maximum bandwidth and minimum current drain from the battery resulted in an amplifier circuit as illustrated in FIG. 3A that is capable of processing a sensed 5 volt signal to produce a 1.0 volt output signal at 5 MHz, and to produce a 0.5 volt output signal at 10 MHz has a maximum gain bandwidth product of 1.0 MHz and a battery current drain on the order of 80 milliamperes.

Figure 3B:
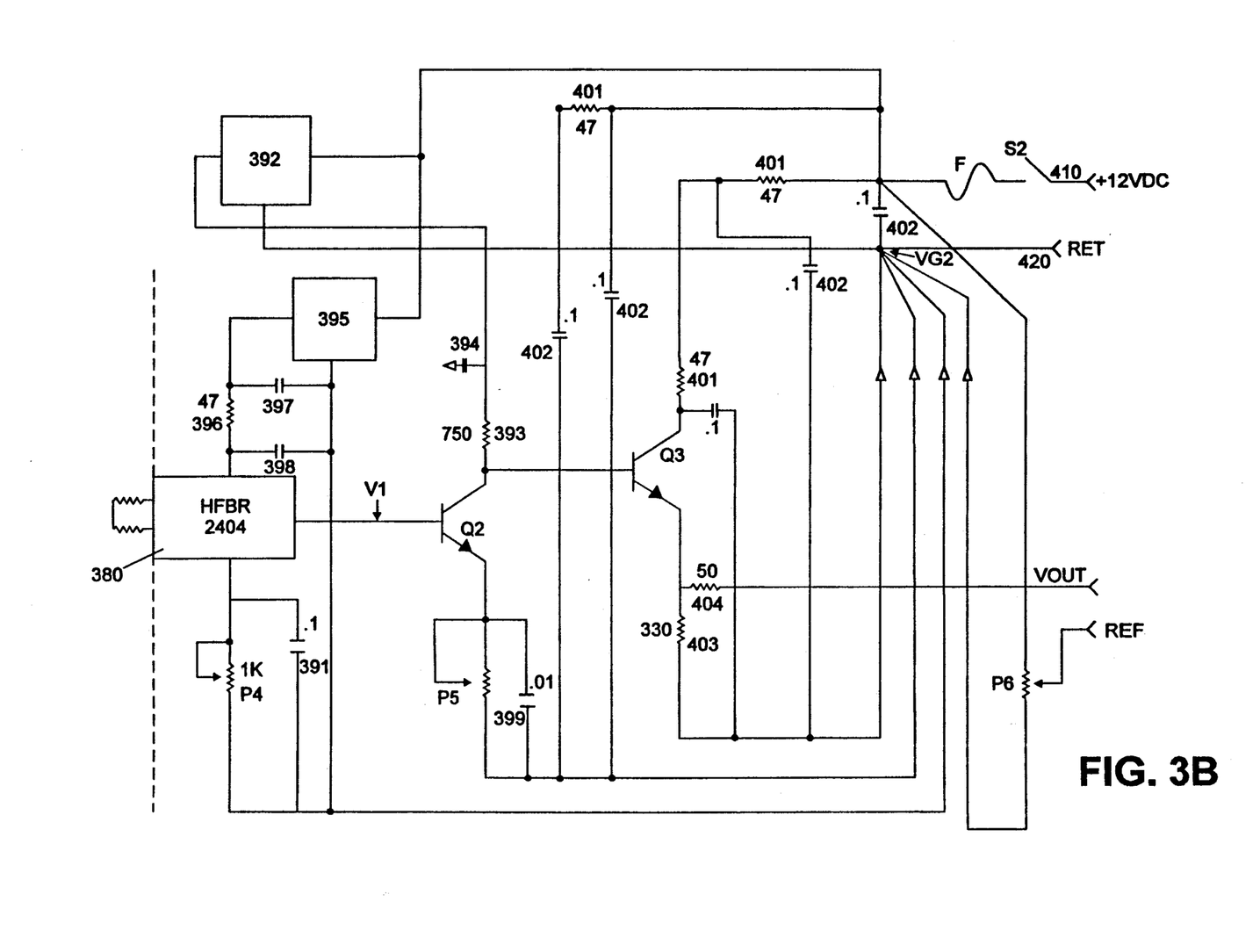
FIG. 3B is a circuit schematic for the analog channel optical to electrical receiver of FIG. 3.

Referring now to FIGS. 3 and 3B, a receiver 60 for receiving the optical signal transmitted from converter 30 of module 10 is shown. A light detector 380 is used to convert the analog optical signal to an analog voltage signal. Detector 380 is preferably an integrated photodiode-amplifier circuit, such as part no. HFBR 2404, available from Hewlett Packard. As shown in FIG. 3B, detector 380 has a variable DC offset voltage, provided by circuit 390, that is used to compensate for changes in the DC operating levels of the direct coupled amplifiers of converter circuit 30. Circuit 390 has a potentiometer P4 and a 0.1 $\mu$f capacitor 391, connected in parallel to a virtual ground at node VG2 (described below). Detector 380 has a regulated +5 volt supply, which is provided by a +5 volt regulator 395, and which is passed across decoupling resistor 396 and capacitors 397 and 398. Resistor 396 is 47 $\Omega$, and capacitors 397 and 398 are each 0.1 $\mu$f.

In the preferred embodiment, offset circuit 390 is used to overcome a discovered limitation in design of the HP HFBR 2404 device, which has an AC coupled output that limits its DC output to a maximum voltage of +0.43 V. This voltage level is inadequate to drive RF transistor Q2, which is a model 2N3904 or equivalent transistor, to maintain a DC bias voltage which is desirable for monitoring the effects of radiation fields.

As is noted below, one possible effect is an inversion of the monitored voltage signal. Thus, if the DC bias level of receiver 60 were 0, the magnitude of the inversion could not be monitored or evaluated. The same is true for the output of receiver circuit 30. Circuit 390, however, provides for adjusting potentiometer P4 to raise the DC potential of device HFBR 2404 to a level sufficient to drive transistor Q2, e.g., between 0.5 and 1.5 volts. Potentiometer P4 could be replaced with a fixed resistor when a desired bias is obtained. For example, potentiometer P4 could be set at or replaced with a resistor of 202 Ω to obtain output of detector 380 at 75 volts. This provides for a bias level of +3 volts output at the collector of transistor Q3, which is adequate to display effects of the radiation field.

The output of the HP HFBR 2402 device is then passed to the base of transistor Q2. The collector of transistor Q2 is provided with a regulated +6 volt supply from +6 volt regulator 392 that is passed across a current limiting resistor 393 of 750 Ω and a capacitor 394 (0.1 μf). Capacitor 394 is connected to virtual ground VG2. Each of regulators 392 and 395 are provided with a +12 volt supply at input 410 (across on/off switch 52 and fuse F) and a virtual ground at node VG2. The virtual ground VG2 is at input 420 and is the return current path to the +12 volt DC power supply for receiver 60. As is the case with conductor circuit 30, every element of circuit that is connected to the virtual ground is shown connected to node VG2 by a separate conductor to minimize noise.

The emitter of transistor Q2 is connected to virtual ground VG2 across a bias level circuit including potentiometer P5 (1.0 KΩ potentiometer) in parallel with a capacitor 399 (0.01 μf). Potentiometer P5 is adjusted to set the proper bias level for transistor Q2 to have the quiescent operating point centered on the load line of the transistor.

The collector of transistor Q2 is connected to the base of transistor Q3, which is a 2N3904 transistor or equivalent. The collector of transistor Q3 is connected to the +12 volt supply over decoupling resistors 401, each of which is 47 Ω, and capacitors 402, each of which is 0.1 μf, as illustrated in FIG. 3B. The emitter of transistor Q3 is connected to virtual ground at node VG2 across resistor 403, a 330 Ω resistor, and to output $V_{OUT}$ across a resistor 404, a 50 Ω resistor. Other decoupling resistors 401 (47 Ω) and capacitors 402 (0.1 μf) are illustrated in FIG. 3B.

The +6 volt regulator 392 and +5 volt regulator 395 are used to provide drift control for circuit 60, to maintain DC drift to less than 10 mV. The receiver circuit 60 provides output signals that vary by about 3–4 volts in response to the optical input signal. Thus, it is preferred to use a display device 70 that has an adjustable gain, such as an oscilloscope or multi-channel oscilloscope, to amplify the output signal at $V_{OUT}$ to a desired amplitude peak to peak swing range, e.g., ±6 volts.

Circuit 60 also includes a circuit for adjusting the bias level of the signal $V_{OUT}$ by incorporating a potentiometer P6 across the input terminals 410 and 420 and using the potentiometer wiper as a reference output REF. Thus, by adjusting the potentiometer P6, the DC bias level of signal $V_{OUT}$ may be selected without affecting the waveform of signal $V_{OUT}$. Potentiometer P6 preferably is a 3 KΩ potentiometer.

Receiver circuit 60 is preferably provided with a 50 ohm output which may be varied as needed to be coupled to a display device.

The DC offset voltage shift circuit 390 for device HP HFBR 2404 is not required for optical transmission links that do not transmit DC waveforms or that employ an analog-to-digital converter at the output of the optical receiver device chip. AC coupling for digital signals at a rate greater than 0.1 Hz may be used. The light source LED 310 and light detecting photodiode-amplifier 395 in such instance, carry digital data which is not affected by the nonlinear LED transmission characteristics. The problem with such an approach, however, is that it masks changes in the sensed voltage waveforms that occur when they become susceptible to EMI. Digital logic circuits tend to ignore device under test waveform changes that indicate the onset of EMI susceptibility until the changes becomes sufficiently large to be catastrophic. Thus, digital logic circuits do not readily identify the onset of EMI susceptibility.

A transmitter and a compatible receiver for a digital channel voltage probe transmission link may be adapted by a person of ordinary skill in the art from FIGS. 3, 3A and 3B, and by referring to U.S. Pat. No. 4,937,446, specifically to FIG. 3 and column 4, line 39 to column 5, line 3 of that patent, and the digital channel of the aforementioned ETVL commercial product. The digital channel converter and receiver circuit architecture should be essentially the same as the analog transmitter 10 and receiver 60 configuration indicated in FIGS. 3, 3A and 3B. However, transmitter amplifier A4 is not required for a digital channel and may be omitted or replaced with a transistor amplifier. With respect to the digital receiver, a digital to analog converter may be used to reproduce analog signal waveforms at $V_{OUT}$.

The 25 nanosecond rise and fall times of the digital transmission link switching waveforms are governed by the distributed capacitance of the voltage probe input conductor nonmetallic material. Digital channel rise times are 30 nanoseconds. The key to a high gain bandwidth product is the ability to maintain distributed capacitance as low as possible. A compromise in amplifier chip and discrete resistor value vs. current drain is obtained. This resulted in a 80 milliampere current drain and a bandwidth from 0.1 Hz to 30 MHz. The digital receiver also is configured to provide a 50 ohm output impedance in order to accommodate spectrum analyzer monitoring of monitored waveforms from device 100.

The HFBR 1404 transmitting LED device and the HFBR 2404 receiver LED device are well matched for use in the present invention.

A Hewlett Packard 8012B pulse generator having rise and fall times as short as 5 nanoseconds may be used as a design tool. The digital transmission link should follow these rise and fall times well enough to provide a 4-volt signal output with a 4-volt generator input at 10 MHz. Slight changes in the generator rise and fall times and height should be easily detectable at the digital channel output.

The hardened optical receiver circuit 60 is a direct coupled two stage RF amplifier composed of discrete circuits for maximum switching rise time and fall times. This is not necessary when in the presence of far fields generated by antennas that are one meter, or further, from the device 100 and optical transmission link. Grounding the transmitter 10 and base 20 prevents near field (less than 3 meters) capacitive coupling into the transmitter 10 enclosures and interfering with the internal circuitry. Capacitively coupled RF will penetrate any metal enclosure regardless of how thick, unless it is connected to a good low impedance RF ground.

The effect of susceptibility to electromagnetic radiation of a device under test is seen referring to FIGS. 5A, 5B, 5C and 5D and using a two-channel transmission link. These figures reflect data recorded in a screen room enclosure at different intensity levels of a controlled EMI field and frequencies using a digital channel.

FIGS. 5A–5D are based on photographs of an oscilloscope displaying signals monitored by a two channel voltage probe transmission link of the present invention wherein one voltage probe included a clip type grabber monitoring a 5 volt DC input pin on a transmitter microprocessor and the other voltage probe included a clip type grabber monitoring the output pin of a logic gate in the receiver module of device 100. The monitored transmitted pulse train in FIGS. 5A–5D is on the bottom trace. The monitored received pulse train is on the top trace. The reduced rise time of the received pulse is due to the effect of harness capacitance.

Figure 5A:
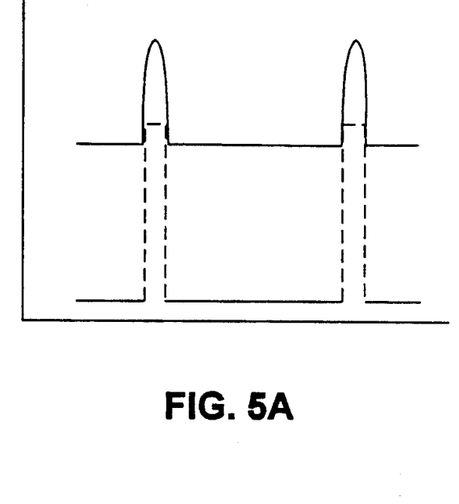
FIGS. 5A, 5B, 5C, and 5D are representations showing the effects of a radiation field for two test points of a device under test before and after the effects appear.
Figure 5B:
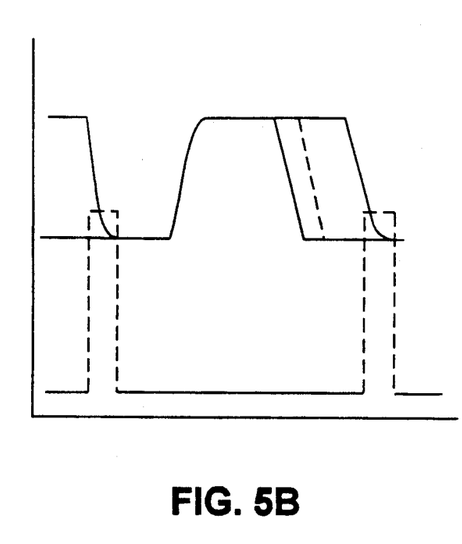

The waveforms just before susceptibility at 50.68 MHz and a field intensity level of 45 V/m are shown in FIG. 5A. FIG. 5B illustrates the effect of raising the field intensity level to 78 V/m and maintaining the frequency constant. A comparison of FIGS. 5A and 5B indicates that the controlled radiation field affected the signal transmission within the device under test. The transmitted pulse contains modulated RF and the received pulse is widened and inverted.

Figure 5C:
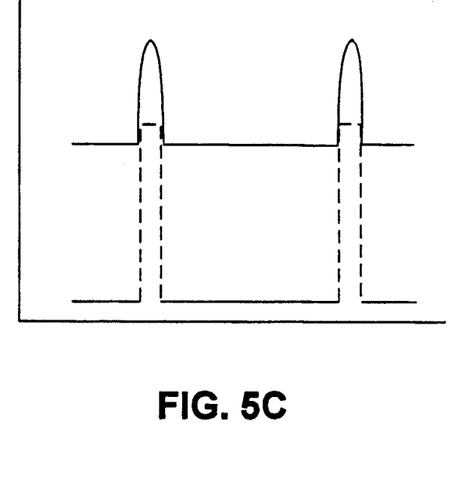
Figure 5D:
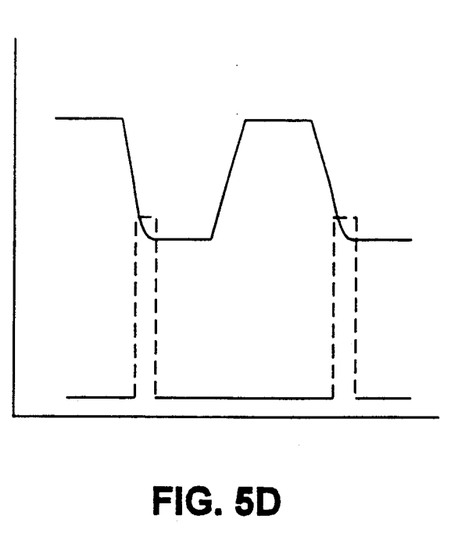

FIG. 5C shows the waveforms at 101.8 MHz and below 20 V/m, just before the onset of susceptibility. It can be seen that the transmitted pulses are modulating the RF at this point, but not enough noise is present to affect the received pulses. FIG. 5D shows the increase in susceptibility that occurred with just a slight increase in field intensity level, from 20 V/m to 35 V/m, at that same frequency.

The information illustrated in FIGS. 5A–5D could not have been obtained by visually monitoring the voltage displays of the device under test or with conventional current probes used in susceptibility testing or a single channel commercial ETVL product.

The 5-volt DC input pin on the device microprocessor transmitter was decoupled to ground with a suitable EMI filter, and another EMI filter was placed in series with the microprocessor output lead to an input signal conditioning circuit in the receiver of the device. The device under test was thus made EMI compatible with the above filters. Referring to FIG. 6, which is in the same format as FIGS. 5A–5D, plots representative of a frequency sweep from 20 to over 200 MHz with the E field intensity level at 100 V/m are shown. These signals indicate that the waveform distortion from the radiation field had been essentially eliminated. A minor (1%) increase in the transmitted pulse rate was noted between 191 and 204 MHz.

Referring to FIG. 1, transmitter 10 includes a rechargeable 12-volt battery 40 which can be switched out when an external battery 80 (FIG. 2) is used. The internal battery is preferably a 1.2 AH type that provides 10 hours of operation for a digital channel module and 15 hours of operation for an analog channel module before recharge is required.

Referring to FIG. 2, an external battery module 80, coupled to transmitter 10 with TWINAX cables also can be used to provide power for the plurality of transmitters 10 when extended periods of use between recharge are required. TWINAX cables are available from Belden Wire and Cable. Preferably, a +12 volt 4.8 amp hour rechargeable battery pack located within the radiation hardened base 20 is used to provide power to six transmitters 10. Suitable shielded leads and EMI filters may be supplied in series with base 20 and the input power terminals of each transmitter 10 to reduce the possibility of RF (EMI) interference. A larger 60 AH battery may be used external to base 20 with suitable shielded cables and radiation hardening precautions.

Each receiver 60 is preferably powered with a 1.2 amp, 24-volt DC U.S or European compatible wall outlet supply. The supply can provide power for up to 6 receiver modules.

Each of the optical channel converter circuits 30 and receivers 60 are preferably enclosed in 5 inch high, by 1.5 inch wide, by six inch deep, EMI hardened circuit, modular metal cases. Internal module circuitry is electrically and physically isolated from the metal enclosure. Isolated printed circuit boards with ground planes prevent RF currents on the enclosure exterior from entering the transmitter interior or circuitry. Particular attention is paid to package seams in order to prevent interior enclosure resonances at RF frequencies having wavelengths that approach the seam dimensions.

EMI power filters 340 are also provided within each transmitter module 10 (see FIG. 3), as an additional measure, to prevent RF from entering the transmitter circuitry through the shielded power leads. BNC connectors that mate the nonmetallic test probes with the transmitter provide additional EMI immunity.

Screws located on both the individual optical transmitter modules and module rack allow them to be grounded to a copper table top or other RF ground point when in the presence of near fields generated by strip line fixtures or TEM cells. Shielded power leads and EMI filters at the power input of each transmitter module may be required in order to provide maximum transmitter immunity to RF fields as high as 200 V/m between 10 kHz and 18 GHz.

It should be understood that the transmitter configurations that are disclosed in U.S. Pat. No. 4,939,446, which uses three probe connectors to monitor a differential voltage at one test point, and a configuration that uses only two probe connectors for monitoring single ended outputs of device 100, also may be used in the multi-channel embodiment of the present invention.

One skilled in the art will appreciate that the present invention can be practiced by other than the described embodiments which are presented for purposes of illustration and not of limitation.

I claim:

1. Apparatus for monitoring the effect of a radiation field at a plurality of test points of a device under test comprising:

a plurality of voltage probe transmission links, each link comprising:
a voltage probe for contacting and sensing a first voltage signal at one test point;

a converter circuit for converting the first sensed voltage signal to a corresponding optical signal; and a common power supply and a plurality of cables for providing power to said plurality of converter circuits, wherein said common power supply and said plurality of converter circuits are radiation hardened and said voltage probe is transparent to the radiation field so that the apparatus does not inject signals in any of the test points of the device.

2. The apparatus of claim 1 further comprising a plurality of power supplies such that there also is one dedicated power supply for each converter circuit.

3. The apparatus of claim 2 wherein each converter circuit and its associated dedicated power supply are enclosed in a radiation hardened enclosure.

4. The apparatus of claim 2 wherein each dedicated power supply is a rechargeable battery.

5. The apparatus of claim 4 wherein each battery is a +12 volt supply and has a useful life of up to 20 hours.

6. The apparatus of claims 1, 2 or 3, wherein the converter circuit further comprises a circuit for monitoring the level of power supplied and indicating when it falls below a threshold level.

7. The apparatus of claim 1 wherein the common power supply is a rechargeable battery.

8. The apparatus of claim 1 wherein the voltage probe of one or more of the plurality of voltage probe transmission links further comprises first and second voltage probes for contacting the device under test at first and second locations corresponding to the one test point, wherein the first sensed voltage signal is the voltage sensed between the first and second locations.

9. The apparatus of claim 8 further comprising a plurality of dedicated power supplies such that there is one dedicated power supply for each converter circuit.

10. The apparatus of claim 9 wherein each power supply is a rechargeable battery.

11. The apparatus of claim 1 wherein each link further comprises:

a receiver for receiving an optical signal and converting it to a display signal corresponding to the first sensed voltage; and an optical transmission line for transmitting the optical signal from the converter to the receiver; and further comprising a display for viewing the sensed signals at one or more of the test points of the device under test.

12. The apparatus of claim 1 further comprising a base having a plurality of positions for removably mounting the plurality of converter circuits.

13. The apparatus of claim 12 wherein the base further comprises a receptacle for the common power supply and plurality of conductors for connecting the power supply to one or more of the plurality of converters.

14. The apparatus of claim 12 wherein the base is radiation hardened.

15. The apparatus of claim 12 wherein the common power supply is associated with the base and further comprising a plurality of shielded conductors for connecting the power supply to one or more of the plurality of converters.

16. The apparatus of claim 12 wherein the common power supply further comprises one or more rechargeable batteries associated with the base, and a corresponding one or more plurality of conductors for connecting the one or more batteries to the plurality of converter circuits.

17. The apparatus of claim 16, further comprising a plurality of power supplies such that each converter circuit also has an internal power supply.

18. The apparatus of claim 17 wherein each converter circuit further comprises a switch for switching out its internal power supply when the converter circuit is connected to the common power supply.

19. The apparatus of claim 17 wherein each of the internal power supplies is a rechargeable battery having the same nominal output voltage as the common power supply.

20. The apparatus of claim 1 wherein the common power supply is at least one rechargeable battery.

21. The apparatus of claim 1 wherein at least one of the plurality of voltage probe transmission links is an analog channel wherein the converter circuit converts the sensed voltage signal at the test point into an analog optical signal corresponding to the sensed voltage.

22. The apparatus of claim 21, wherein analog channel has a bandwidth from DC to 5 MHz.

23. The apparatus of claim 1, 2, 7, 8, 11, 12, 20 or 21 wherein the voltage probe further comprises a circuit grabber for contacting the one test point and an electrically overdamped input conductor having a distributed impedance for conducting the voltage signal at the circuit grabber to the converter circuit.

24. The apparatus of claim 23 wherein each input conductor is one or more strands of a slurry of carbon and fluorocarbon materials having a diameter on the order of 0.76 mm.

25. A method for monitoring the effect of a radiation field at a plurality of test points of a device under test comprising:

providing a plurality of voltage probe transmission links, each link including an electromagnetically transparent voltage probe for contacting and sensing a first voltage signal at one test point and a converter circuit for converting the first sensed voltage signal to a corresponding optical signal;

providing power to the plurality of converter circuits from a common power supply using a plurality of cables connecting said plurality of converter circuits to the common power supply;

radiation hardening said common power supply and said pluralities of cables and converter circuits;

contacting said plurality of test points with the plurality of voltage probes so that the voltage probes do not inject signals in any of the test points of the device; and monitoring the voltage signals sensed at the plurality of test points.

26. The method of claim 25 wherein providing power further comprises providing one or more of the plurality of converter circuits with a dedicated power supply.

27. The method of claim 26 further comprising enclosing each said one or more converter circuits and its associated dedicated power supply in a radiation hardened enclosure.

28. The method of claims 26 or 27, further comprising monitoring the level of power supplied to each converter circuit and indicating when the level of power falls below a threshold level.

29. The method of claim 26 further comprises switching out the internal power supply of a converter circuit when the converter circuit is connected to the common power supply.

30. The method of claim 25 wherein the voltage probe of one or more of the plurality of voltage probe transmission links is a first and second voltage probes and contacting the device under test at a test point further comprises contacting the first and second voltage probes to first and second locations corresponding to the one test point, and monitoring the voltage sensed between the first and second locations.

31. The method of claim 30 further comprising providing a plurality of dedicated power supplies such that there is one dedicated power supply for each converter circuit.

32. The method of claim 25 wherein monitoring the plurality of test points further comprise:

transmitting the plurality of optical signals from the converter circuits out of the test radiation field;

converting the transmitted optical signals to display signals corresponding to the plurality of first sensed voltages; and displaying the monitored signals at one or more of the test points of the device under test.

33. The method of claim 32 wherein at least one of the plurality of voltage probe transmission links is an analog channel, wherein the step of monitoring the voltage signals using said analog channels further comprises converting the sensed voltage signal at the test point into an analog optical signal corresponding to the sensed voltage prior to converting the sensed first signal into an optical signal.

34. The method of claim 25 further comprising enclosing each converter circuit in an enclosure and mounting the plurality of enclosures in a base having a plurality of positions for removably mounting the plurality of enclosures.

35. The apparatus of claim 34 wherein mounting each enclosure to the base further comprises connecting the power supply to the converter circuit of each said mounted enclosure.

36. The apparatus of claim 34 wherein the common power supply is associated with the base and is connected to one or more of the plurality of converters by using shielded conductors.

* * * * *